United States Patent [19]

Tabata

[11] Patent Number: 5,433,624
[45] Date of Patent: Jul. 18, 1995

[54] CONNECTOR

[75] Inventor: Masaaki Tabata, Yokkaichi, Japan

[73] Assignee: Sumitomo Wiring Systems, Ltd., Japan

[21] Appl. No.: 287,864

[22] Filed: Aug. 9, 1994

[30] Foreign Application Priority Data

Aug. 18, 1993 [JP] Japan .................................. 5-226471

[51] Int. Cl.⁶ .......................................... H01R 13/629
[52] U.S. Cl. ...................................... 439/381; 439/79
[58] Field of Search ................................. 439/381, 79

[56] References Cited

U.S. PATENT DOCUMENTS 4,857,017  8/1989  Erk .......................................... 439/79
4,955,819  9/1990  Harting et al. ......................... 439/79

FOREIGN PATENT DOCUMENTS 128575  6/1988  Japan .

Primary Examiner—Gary F. Paumen
Attorney, Agent, or Firm—Jordan B. Bierman; Bierman and Muserlian

[57] ABSTRACT

This invention provides a connector which can readily position distal ends of terminal pins 2. The connector comprises a plurality of terminal pins 2 having ends extending perpendicularly from a connector body 1 and a comb like longitudinal positioning member 3. A comb like lateral positioning member 4 is attached to the longitudinal positioning member 3 in a vertical direction, thereby positioning distal ends of the terminal pins 2. The positioning members 3 and 4 enclose the distal ends of the terminal pins 2 in a grid manner to position the distal ends longitudinally and laterally.

4 Claims, 3 Drawing Sheets

CONNECTOR

BACKGROUND OF THE INVENTION

1. Field of the Invention

This invention relates to a connector which is attached to a support plate by inserting a plurality of terminal pins of the connector into apertures in the support plate.

2. Statement of the Prior Art

A connector is known which connects wiring cables to terminals on a printed circuit plate or the like. This connector is provided with a plurality of projected terminal pins adapted to be inserted into holes in the terminals. Since the terminal pins must be inserted into small insertion holes at the same time upon attaching, attaching work is troublesome. For example, the connector cannot be attached to the printed circuit plate if distal ends of some of the terminal pins are deflected from the given positions. In particular, the terminal pins of the connector are made of a bendable metal strip and are projected away from the connector body. An arrangement of the distal ends is likely to go out of control and thus will misconnect with the insertion holes. Consequently, heretofore, the terminal pins have been inserted into the insertion holes while adjusting the arrangement of the pins.

In order to overcome the above problem, Japanese Patent Public Disclosure No. 62-186784 (1987) discloses a connector. For convenience of explanation, the disclosed connector will be described below by referring to FIGS. 5 and 6. FIG. 5 is a perspective view of the prior connector, illustrating a state before being assembled. FIG. 6 is a perspective view of the prior connector illustrating an assembled state. As shown in FIGS. 5 and 6, a positioning plate c, which is provided with positioning holes d corresponding to insertion holes in a printed circuit plate, is attached to a connector body a. The distal ends of terminal pins b are inserted into the positioning holes d. Thus, an arrangement of the distal ends of the terminal pins b is brought into coincidence with an arrangement of the insertion holes.

However, a plurality of terminal pins which are disordered must be inserted into the positioning holes at the same time in the prior art. This is troublesome in the same manner of inserting the terminal pins into the insertion holes in the printed circuit plate without positioning the pins. Although the above work becomes easy at the stage of attaching the connector to the printed circuit plate, it is necessary to position the pins in order to attach the positioning plate c to the connector body a. Ultimately, the prior art cannot eliminate the troublesome work to insert the terminal pins into the small holes.

SUMMARY OF THE INVENTION

An object of the present invention is to provide a connector which can easily position distal ends of terminal pins.

In order to achieve the above object, a connector which has a plurality of terminal pins each distal end of which is bent to perpendicularly project from one side of a connector body, in accordance with the present invention, comprises:

a longitudinal positioning member having a first comb like portion directed to the distal ends of the terminal pins; and a lateral positioning member having a second comb like portion directed vertically to the first comb like portion to enclose the terminal pins in a grid manner when attached to the first comb like portion.

The longitudinal positioning member may be joined together to the connector body. The longitudinal positioning member may be a different part from the connector body to be detachably attached to the connector body.

The longitudinal positioning member may be provided in its side portion with guide holes to receive the lateral positioning member.

According to the present invention, the longitudinal positioning member projects in the direction of the terminal pins projected from the connector body and the distal ends of the terminal pins bent perpendicularly from the proximal ends of the pins are clamped by the comb like portion. The distal ends of the terminal pins are positioned in the lateral direction. Also, the lateral positioning member having the second comb like portion is attached to the connector body in the direction perpendicular to the longitudinal positioning member, thereby positioning the distal ends of the terminal pins in the longitudinal direction. The distal ends of the terminal pins are enclosed in the grid manner by the opposite positioning members and positioned in longitudinal and lateral directions. After longitudinally positioning the pins by the longitudinal positioning member, the lateral positioning member effects the lateral positioning. As these two steps can be carried out easily, it is possible to dispose the distal ends of the terminal pins in regular positions.

When the longitudinal positioning member is united with the connector body, there is no play between them, thereby increasing an accuracy of positioning.

When the longitudinal positioning member is separated from the connector body, the connector body can be made inexpensively.

When the longitudinal positioning member is provided in its side portion with the guide holes adapted to receive the lateral positioning member, the lateral positioning of the terminal pins can be easily done merely by inserting the lateral positioning member into the guide aperture.

According to the present invention, the distal ends of the terminal pins are laterally positioned by the lateral positioning member after they are longitudinally positioned by the longitudinal positioning member. These two steps make it easy to position the distal ends of the terminal pins, thereby readily attaching the connector to the supporting plate.

DETAILED DESCRIPTION OF THE PREFERRED EMBODIMENTS

An embodiment of a connector in accordance with the present invention will be described by referring to FIGS. 1 through 4.

Figure 1:
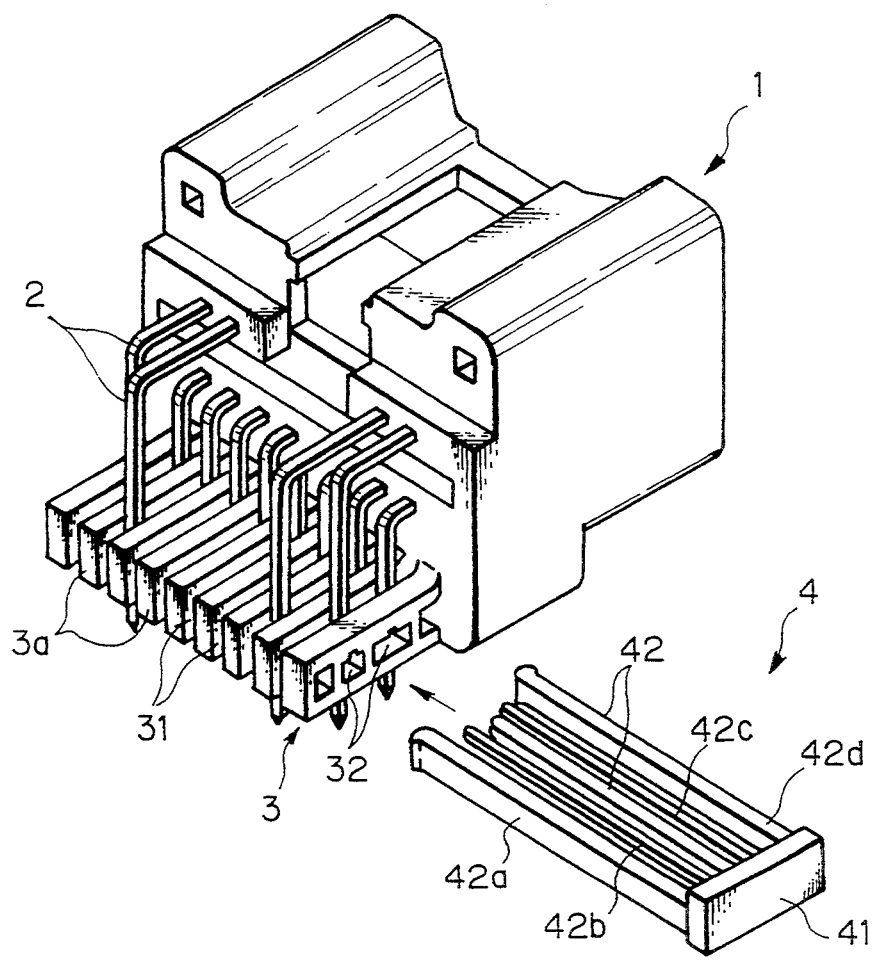
FIG. 1 is an exploded perspective view of a connector of the present invention, illustrating a state before assembly.

As shown in FIG. 1, a connector in this embodiment comprises a connector body 1, terminal pins 2 projected from a front face of the connector body 1, a comb like longitudinal positioning member 3 which clamps the distal ends of the terminal pins 2 and a lateral positioning member 4 attached perpendicularly to the longitudinal positioning member 3.

Figure 2:
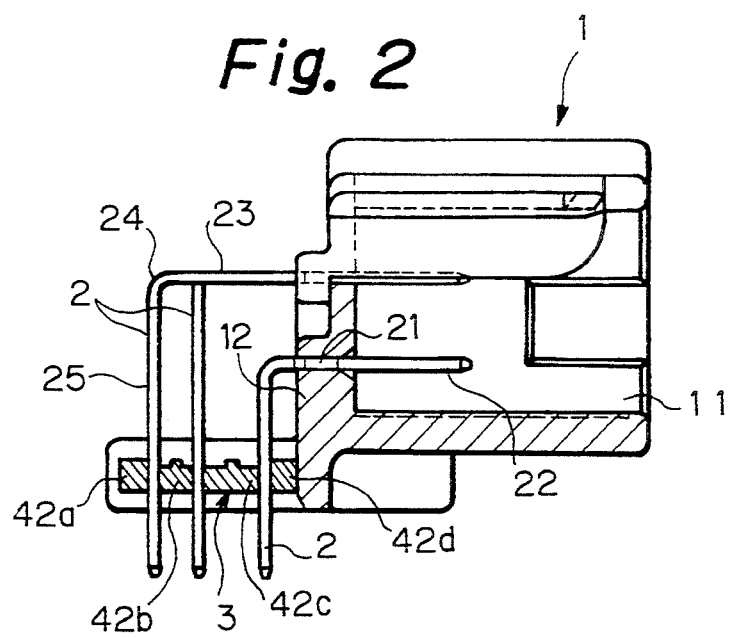
FIG. 2 is a longitudinal cross sectional view of the connector shown in FIG. 1, illustrating an assembled state.

The connector body 1, as shown in FIG. 2, is formed into a housing with a bottom wall and made of an insulating synthetic resin material. The connector body 1 is provided with a coupling chamber 11 to receive a female connector not shown. A plurality of terminal pins 2 are inserted through attaching apertures in a front wall or bottom wall 12 of the coupling chamber 11 in upper and lower arrays. The terminal pin 2 is made of a conductive thin metal bar, pushed into the attaching aperture in the front wall 12 and bent vertically at its distal end in the outside of the connector body 1. The terminal pin 2 includes a fixed portion pushed in the front wall 12, a male terminal portion 22 projected in the coupling chamber 11, an extending portion 23 projected horizontally and an end portion 25 bent at a curved portion 24 from the extending portion 23. The distal end of the end portion 25 is adapted to be inserted into an insertion hole in a printed circuit plate not shown. In the present embodiment, four and eight of the terminal pins 2 are arranged at the upper and lower arrays on the front walls 12 and disposed in the insertion holes in three arrays.

The front wall 12 is provided on its lower end with a longitudinal positioning member 3. The member 3 is united with the wall 12 below the extending portion 23 of the terminal pin 2. The member 3 is provided with a plurality of comb like ribs 3a (see FIG. 1) corresponding to the end portions 25 of the terminal pins 2. A gap (positioning groove 31) between the ribs 3a receives the end portion 25 of the pin 2. The terminal pin 2 can move forwards and backwards (longitudinally) in the positioning groove 31, but the pin 2 cannot move to the right or left (laterally) in the groove 31 by the ribs 3a. Consequently, the pins 2 are positioned laterally in the member 3.

Figure 4:
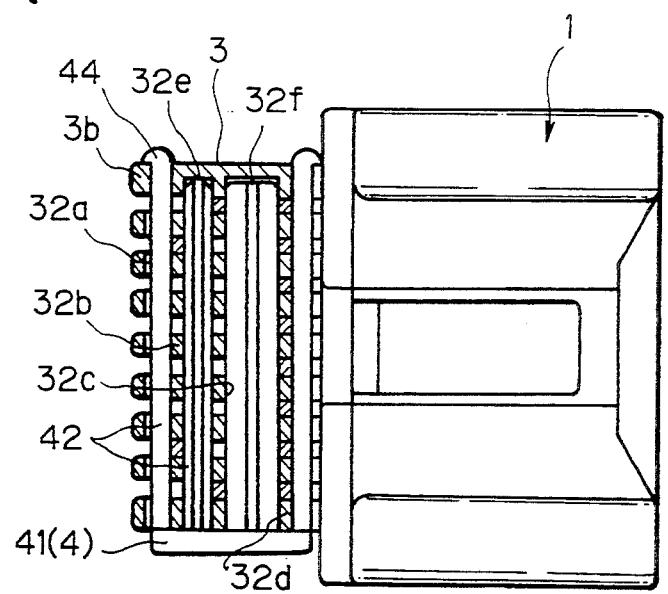
FIG. 4 is a partially broken away plan view of the connector shown in FIG. 2.

Each of the ribs 3a are provided in its side portion with four guide holes 32a, 32b, 32c and 32d which constitute a positioning aperture 32 adapted to receive the lateral positioning member 4. The guide holes 32a to 32d are arranged on opposite sides of the end portions 25 of the terminal pins 2 in three arrays so that the pins 2 in their regular positions do not interfere with the holes 32a to 32d. The uppermost rib 3a of the ribs 3a in FIG. 4 is provided in its inner face with two recesses 32e and 32f. The lateral positioning member 4 is inserted into the positioning aperture 32.

The lateral positioning member 4 is made of an insulating synthetic resin material. The member 4 includes a base plate 41 and four positioning bars 42 (42a to 42d) which extend parallel to each other from the base plate 41 to define a comb like shape. The positioning bars 42a to 42d are arranged on the base plate 41 so that the bars 42a to 42d clamp the terminal pins 2 in the regular positions when the bars are inserted into the guide holes 32a to 32d. The positioning bars 42a to 42d are provided with tapered distal ends 43. The right and left positioning bars 42d and 42a are provided with pawls 44 on their ends. When the lateral positioning member 4 is inserted into the positioning aperture 32, the comb like ribs 3a of the member 3 and the comb like bars 42a to 42d of the member 4 enclose the end portions 25 of the terminal pins 2 in the grid manner, thereby positioning the end portions 25 of the pins at the regular position.

Next, an operation of the connector will be explained below in accordance with processes for producing the connector.

The terminal pins 2 are pressed into the front wall 12 of the connector body 1 formed by a molding machine. The terminal pins 2 pressed in the front wall 12 are bent at curved portions 24 by about 90 degrees so that the end portions 25 pass through the positioning grooves 31 in the longitudinal positioning member 3. Since the longitudinal positioning member 3 is formed into a comb like configuration at its end, each terminal pin 2 is inserted into the groove 31 while being bent, whereby the pin 2 is positioned in regular right and left directions. The connector body 1 thus constructed is cared to a step of attaching the lateral positioning member 4 to the body 1.

In the step of inserting the positioning bars 42a to 42d into the guide holes 32a to 32d, even if the terminal pins 2 are deflected from the regular positions, the terminal pins 2 are corrected to regular positions by the tapered ends 43 of the positioning bars 42a to 42d. Thus inserting work is not impeded by the deflected terminal pins 2.

Figure 3:
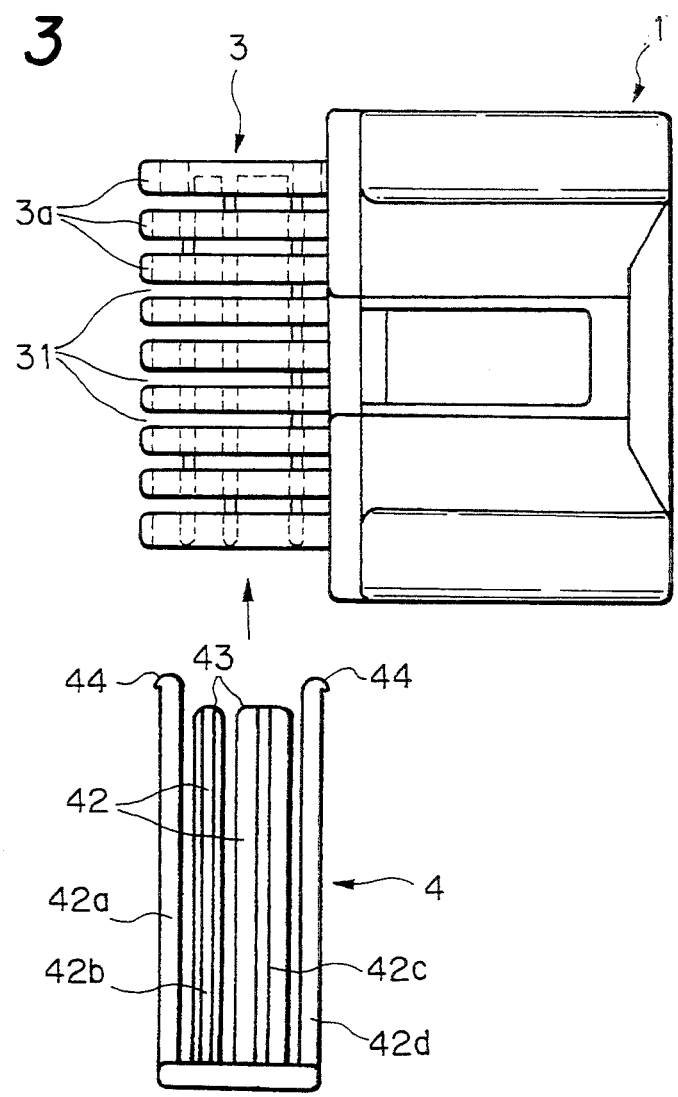
FIG. 3 is a plan view of the connector shown in FIG. 1, illustrating a state before assembling.

When the base plate 41 is pushed from the position shown in FIG. 3 to the position shown in FIG. 4, in which the plate 41 contacts with rib 3a in the nearest front side, the positioning bars 42b and 42c are received in the recesses 32e and 32f at their distal ends. The positioning bars 42a and 42d enter into the guide holes 32a and 32d and are locked on the rib 3b by the pawls 44, thereby locking the lateral positioning member 4 to the longitudinal positioning member 3. Consequently, the distal ends of the terminal pins 2 are positioned in the right and left directions and in the forwards and backwards directions, so that the distal ends are thus arranged in accordance with the insertion holes in the printed circuit plate.

Thus, the connector can be readily mounted on the printed circuit plate, since the terminal pins 2 are disposed precisely in accordance with the insertion holes in the present circuit plate.

As described above, the present embodiment does not insert the terminal pins into the small holes simultaneously as in the prior art, but positions the pins in the right and left directions by these longitudinal positioning member 3, and then positions the pins in the forward and backward directions. It is possible to easily and precisely position the terminal pins 2 in the regular positions by these two simple steps.

Figure 5:
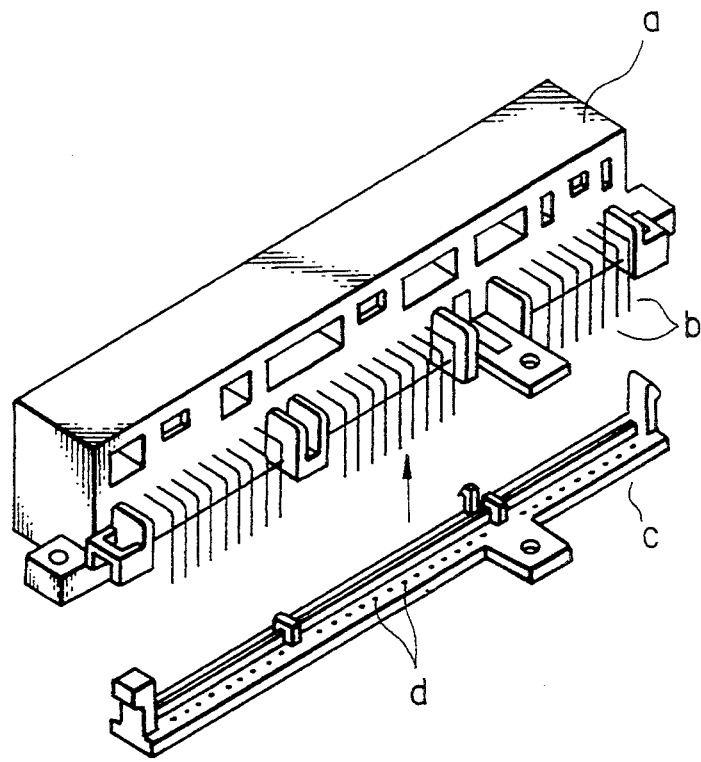
FIG. 5 is an exploded perspective view of a conventional connector, illustrating a state before assembling.
Figure 6:
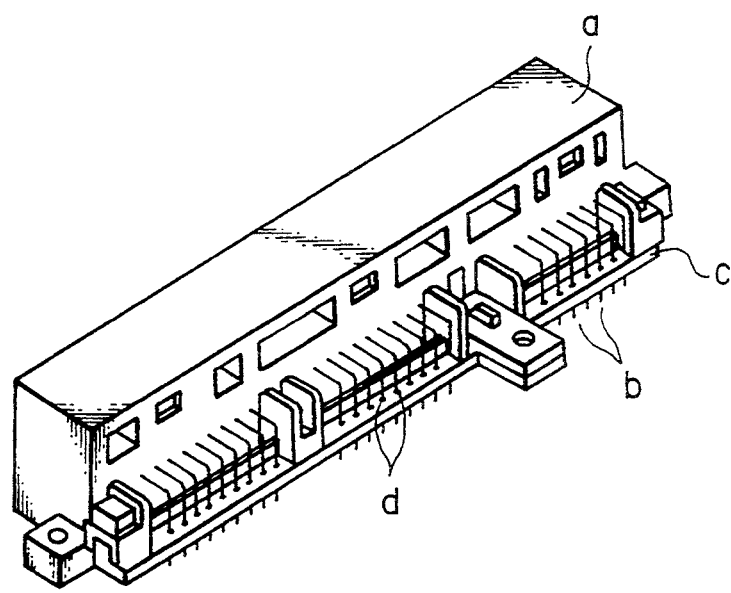
FIG. 6 is a perspective view of the assembled connector.

In the above embodiment, since the longitudinal positioning member 3 is united with the connector body 1 and the lateral positioning member 4 is inserted into the positioning aperture 32 in the member 3, there is no play between all the parts. In comparison with the conventional positioning plate c (FIG. 5), the connector of the present invention does not bring about lowering of positioning accuracy and can enhance the positioning accuracy.

Also, in the above embodiment the ribs 3a are provided in their side portions with the guide holes 32a to 32d and the positioning bars 42 are supported in the holes to prevent the bars from being deflected, thereby further enhancing the positioning accuracy.

The present invention should not be limited to the above embodiment. The present invention may be altered to, for example, the following examples:

(1) In the above embodiment, the terminal pins 2 are pressed into the insertion holes in the connector body 1. The terminal pins 2 may be attached to the body 1 by means of engaging members or insert molding.

(2) In the above embodiment, the longitudinal positioning member 3 is united with the connector body 1. The member 3 may be formed into a separate part from the body 1 so that the member 3 is assembled to the body 1.

(3) In this embodiment, the lateral positioning member 4 is inserted into the positioning aperture 32 in the longitudinal positioning member 3. The comb like lateral positioning member may be mounted on an upper or lower side of the longitudinal positioning member.

(4) In this embodiment, the longitudinal positioning member 3 is provided with the guide holes 32a to 32d. However, it is not necessary to provide guide holes in the member 4 in connection with the positioning bars 42a to 42d. The member 3 may be provided with a single guide hole to receive all of the positioning bars 42a to 42d.

(5) In this embodiment, the lateral positioning member 4 is inserted into one side of the longitudinal positioning member 3. Each of two members 4 is inserted into the member 3 from its right and left sides. The member 4 may be divided into a plurality of positioning bars so that each bar is inserted into each positioning holes.

In summary, the present invention does not insert the terminal pins into small insertion holes simultaneously but carries out two steps of positioning the pins by the comb like portion In one direction and then positioning them by the comb like portion in another direction perpendicular to one direction.

What is claimed is:

1. A connector which has a plurality of terminal pins each having a distal end which is bent to perpendicularly project from one side of a connector body, further comprising:

a longitudinal positioning member having a first comb like portion aligning the distal ends of said terminal pins in a longitudinal direction; and a lateral positioning member having a second comb like portion oriented perpendicular to said first comb like portion and aligning the distal ends of said terminal pins in a lateral direction, said first and second comb like portions enclosing said terminals in a grid.

2. A connector according to claim 1, wherein said longitudinal positioning member is integral with said connector body.

3. A connector according to claim 1, wherein said lateral positioning member is detachably connected to said connector body.

4. A connector according to claim 1, wherein said longitudinal positioning member is provided in a side portion thereof with guide holes to receive said lateral positioning member.

* * * * *